US012712311B2

(12) United States Patent
Parkhe

(10) Patent No.: US 12,712,311 B2
(45) Date of Patent: Aug. 18, 2026

(54) ELECTRICAL CONNECTOR FOR A SUBSTRATE SUPPORT ASSEMBLY

(71) Applicant: Applied Materials, Inc., Santa Clara, CA (US)

(72) Inventor: Vijay D. Parkhe, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 293 days.

(21) Appl. No.: 18/392,814

(22) Filed: Dec. 21, 2023

(65) Prior Publication Data

US 2024/0235097 A1 Jul. 11, 2024

Related U.S. Application Data

(60) Provisional application No. 63/437,844, filed on Jan. 9, 2023.

(51) Int. Cl.
*H01R 13/502* (2006.01)
*H01R 13/05* (2006.01)
(Continued)

(52) U.S. Cl.
CPC ......... *H01R 13/502* (2013.01); *H01R 13/052* (2013.01); *H01R 13/111* (2013.01); *H01R 25/162* (2013.01); *H10P 72/722* (2026.01)

(58) Field of Classification Search
CPC .. H01R 13/502; H01R 13/052; H01R 13/111; H01R 25/162; H01R 13/521; H01R 13/5216; H01L 21/6833; H01L 21/6831
See application file for complete search history.

(56) References Cited

U.S. PATENT DOCUMENTS 12,444,585 B2 * 10/2025 Noujaim ........... H01L 21/67109
2009/0314208 A1 12/2009 Zhou et al.
(Continued)

FOREIGN PATENT DOCUMENTS

TW I536492 B 6/2016
WO 2020123069 A1 6/2020

OTHER PUBLICATIONS

International Search Report Dated Apr. 24, 2024 re: PCT Application No. PCT/US2023/085498.
(Continued)

*Primary Examiner* — Abdullah A Riyami
*Assistant Examiner* — Nader J Alhawamdeh
(74) *Attorney, Agent, or Firm* — Patterson + Sheridan, LLP

(57) ABSTRACT

An electrical connector for a substrate support assembly is disclosed herein. The electrical connector includes a first interface body, a second interface body coupled to the first interface body, and a recess within the second interface body. Each of the first interface body and the second interface body comprise a plurality of electrical terminals disposed in sockets formed within the respective first and second interface bodies. Some electrical terminals disposed in sockets of the first interface body are coupled to respective electrical terminals disposed in sockets of the second interface body and form a plurality of isolated electrical pathways. The second interface body includes a bus bar disposed in the recess, connecting at least two of the plurality of first electrical terminals to at least a one of the plurality of second electrical terminals.

20 Claims, 9 Drawing Sheets

(51) Int. Cl.

| | |
|---|---|
| ***H01R 13/11*** | (2006.01) |
| ***H01R 25/16*** | (2006.01) |
| ***H10P 72/72*** | (2026.01) |

(56) References Cited

U.S. PATENT DOCUMENTS

| | | | | |
|---|---|---|---|---|
| 2014/0339215 | A1 | 11/2014 | Plazonic et al. | |
| 2018/0019535 | A1 | 1/2018 | Uenosono et al. | |
| 2021/0343512 | A1* | 11/2021 | Parkhe | H01L 21/67126 |
| 2021/0375599 | A1* | 12/2021 | Noujaim | H01L 21/6831 |
| 2023/0068968 | A1* | 3/2023 | Sasaki | H01J 37/32715 |
| 2024/0235097 | A1* | 7/2024 | Parkhe | H01R 13/5216 |
| 2025/0323463 | A1* | 10/2025 | Sulyman | H01J 37/32577 |

OTHER PUBLICATIONS

Taiwanese Office Action for Application No. 112150522 dated Mar. 9, 2026.

* cited by examiner

ELECTRICAL CONNECTOR FOR A SUBSTRATE SUPPORT ASSEMBLY

CROSS-REFERENCE TO RELATED APPLICATIONS

This application claims benefit of U.S. Provisional Patent Application No. 63/437,844, filed Jan. 9, 2023, the entirety of which is herein incorporated by reference.

BACKGROUND

Field

Embodiments of the present disclosure generally relate to semiconductor chamber components, and more particularly to an electrical connector for a substrate support assembly for use in high frequency electric fields.

Description of the Related Art

Reliably producing nanometer and smaller features is one of the key technology challenges for next generation very large scale integration (VLSI) and ultra-large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

To drive down manufacturing cost, integrated chip (IC) manufacturers demand higher throughput and better device yield and performance from every silicon substrate processed. Some fabrication techniques being explored for next generation devices under current development require processing at large temperature ranges. For example, dry reactive ion etching a substrate uniformly maintained at a cryogenic temperature enables ions to bombard the upward facing surfaces of materials disposed on the substrate with decreased spontaneous etching so that trenches with smooth, vertical sidewalls are formed. Additionally, selectivity of etching one material versus another can be improved at the cryogenic temperature. For example, selectivity between silicon.

Operating a substrate support assembly at cryogenic temperatures creates challenges. For example, expansion and contraction between layers of the substrate support assembly can cause leakage of fluids and/or vacuum leaks. These challenges extend to providing electrical connections to heaters and/or voltage for chucking within or on the substrate support assembly. In addition, arcing within the substrate support assembly can lead to many problems.

Thus, there is a need for an improved substrate support assembly.

SUMMARY

Embodiments of the present disclosure generally relate to an electrical connector suitable to maintain a vacuum in a process chamber while passing electricity through connections within the connector. In one embodiment, an electrical connector for a substrate support assembly is disclosed herein. The electrical connector includes a first interface body, and a second interface body coupled to the first interface body and a recess disposed within the second interface body. Each of the first interface body and the second interface body comprise a plurality of electrical terminals disposed in sockets formed in the respective first and second interface bodies, some electrical terminal disposed in sockets of the first interface body coupled to a respective one of the electrical terminals disposed in sockets of the second interface body to form a plurality of isolated of electrical pathways, and the second interface body includes a bus bar disposed in the recess, connecting at least two of the plurality of first electrical terminals to at least a one of the plurality of second electrical terminals.

In another embodiment, an electrostatic chuck for semiconductor manufacturing is provided. The electrostatic chuck includes a first plate, a second plate, and an electrical connector disposed between the first plate and the second plate. The electrical connector includes a first interface body, a second interface body coupled to the first interface body, an adhesive, and a bus bar. The first interface body includes a connector cover, an outer face, and a plurality of first electrical terminals. The second interface body includes a plurality of electrical pathways, a plurality of second electrical terminals disposed in a plurality of sockets, and a recess disposed within the second interface body. The recess includes a first vertical face disposed adjacent the outer face of the first interface body. The adhesive is disposed between the first vertical face and the outer face such that a space between the first vertical face and the outer face is void free. The bus bar is disposed in the recess and connects at least two of the plurality of first electrical terminals to at least a one of the plurality of second electrical terminals.

In another embodiment, a substrate support assembly for semiconductor manufacturing is provided. The substrate support assembly includes electrostatic chuck (ESC), an ESC base assembly disposed between the ESC and a facility plate, and an electrical connector disposed between and partially within the ESC base assembly and the facility plate. The electrical connector includes a first interface body, a second interface body coupled to the first interface body, an adhesive, and a bus bar. The first interface body includes a connector cover, an outer face, and a plurality of first electrical terminals. The second interface body includes a plurality of electrical pathways, a plurality of second electrical terminals disposed in a plurality of sockets, and a recess disposed within the second interface body. The recess includes a first vertical face disposed adjacent the outer face of the first interface body. The adhesive is disposed between the first vertical face and the outer face such that a space between the first vertical face and the outer face is void free. The bus bar disposed in the recess, connecting at least two of the plurality of first electrical terminals to at least a one of the plurality of second electrical terminals.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein provide a substrate support assembly which enables a large operational temperature range of an electrostatic chuck (ESC) so that a substrate disposed thereon is maintained at a cryogenic processing temperature suitable for processing while other surfaces of a processing chamber are maintained at a different temperature. The operational temperature range processing temperature (i.e., temperature of the substrate) is intended to refer to temperatures less than −200 degrees Celsius to about 350 degrees Celsius at the substrate support.

Although the substrate support assembly is described below in an etch processing chamber, the substrate support assembly may be utilized in other types of plasma processing chambers, such as physical vapor deposition chambers, chemical vapor deposition chambers, ion implantation chambers, among others, and other systems where processing a substrate maintained at the processing temperature is desirable. It is to be noted however, that the substrate support assemblies and chamber components described herein may be utilized to advantage at other processing temperatures.

Figure 1:
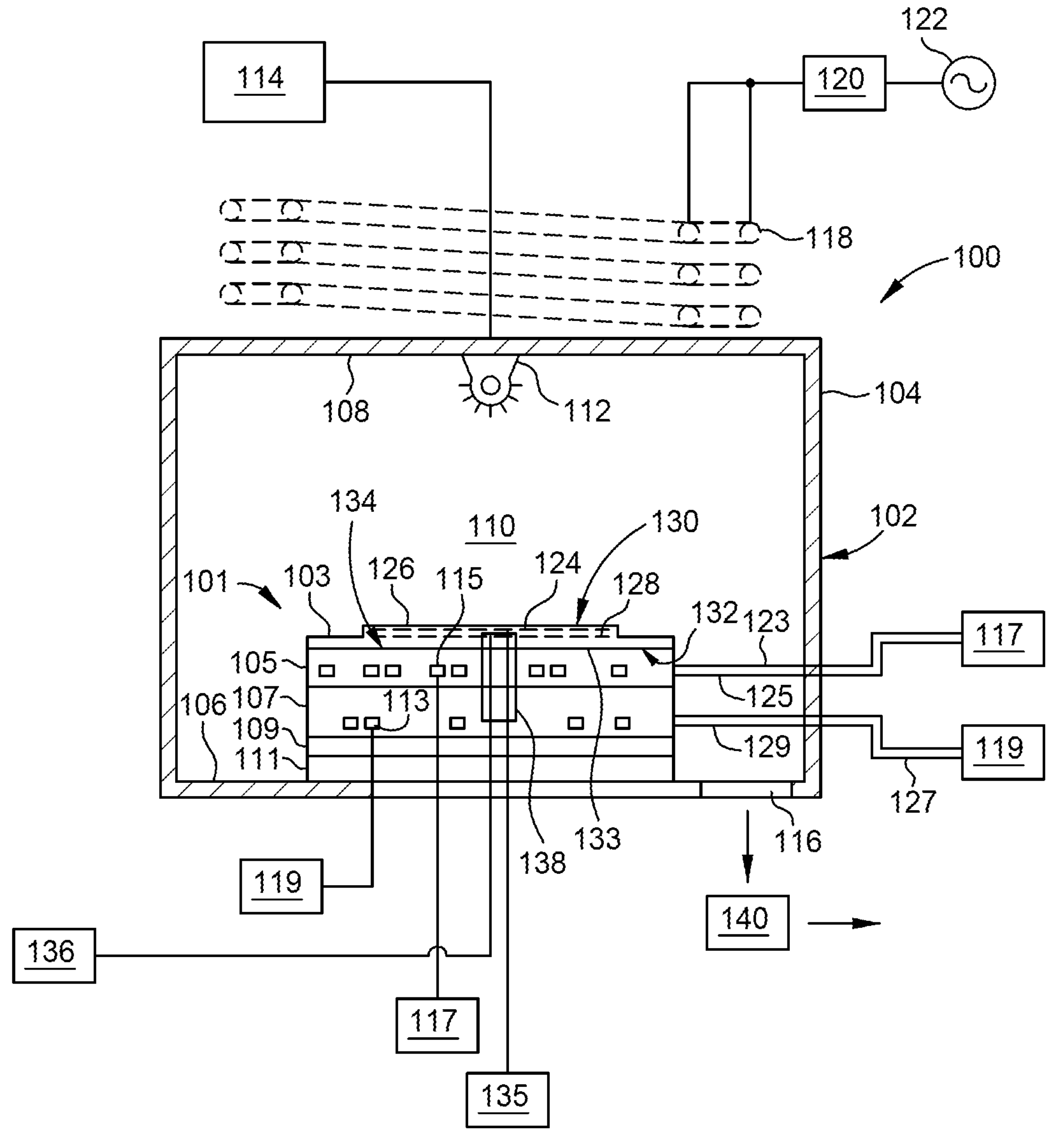
FIG. 1 is a cross-sectional schematic view of an exemplary plasma processing chamber according to an embodiment.

FIG. 1 is a cross-sectional schematic view of an exemplary plasma processing chamber 100, shown configured as an etch chamber, having a substrate support assembly 101. As mentioned above, the substrate support assembly 101 may be utilized in other types of plasma processing chambers, for example plasma treatment chambers, annealing chambers, physical vapor deposition chambers, chemical vapor deposition chambers, and ion implantation chambers, among others, as well as other systems where the ability to uniformly maintain a surface of a workpiece, such as a substrate 124, at a cryogenic processing temperature is desirable. Dry reactive ion etching the substrate 124 maintained within an operational temperature range enables ions to bombard the upward facing surfaces of materials disposed on the substrate 124 with decreased spontaneous etching so that trenches with smooth, vertical sidewalls are formed. For example, diffusion of ions in porosities of a low-k dielectric material disposed on the substrate 124 uniformly maintained within the operational temperature range is decreased while ions continue to bombard the upward facing surface of the low-k dielectric material to form trenches with smooth, vertical sidewalls. Additionally, selectivity of etching one material versus another can be improved at the within the operational temperature range. For example, selectivity between silicon (Si) and silicon dioxide ($SiO_2$) increases exponentially as temperature is decreased.

The plasma processing chamber 100 includes a chamber body 102 having sidewalls 104, a bottom 106 and a lid 108 that enclose a processing region 110. An injection apparatus 112 is coupled to the sidewalls 104 and/or lid 108 of the chamber body 102. A gas panel 114 is coupled to the injection apparatus 112 to allow process gases to be provided into the processing region 110. The injection apparatus 112 may be one or more nozzle or inlet ports, or alternatively a showerhead. Process gases, along with any processing by-products, are removed from the processing region 110 through an exhaust port 116 formed in the sidewalls 104 or bottom 106 of the chamber body 102. The exhaust port 116 is coupled to a pumping system 140, which includes throttle valves and pumps utilized to control the vacuum levels within the processing region 110. Processing by-products are also removed through the exhaust port 116 using the pumping system 140.

The process gases may be energized to form a plasma within the processing region 110. The process gases may be energized by capacitively or inductively coupling RF power to the process gases. In one embodiment, which can be combined with other embodiments described herein, depicted in FIG. 1, a plurality of coils 118 are disposed above the lid 108 of the plasma processing chamber 100 and coupled through a matching circuit 120 to an RF power source 122.

The substrate support assembly 101 is disposed in the processing region 110 below the injection apparatus 112. The substrate support assembly 101 includes an electrostatic chuck (ESC) 103 and an ESC base assembly 105. The ESC base assembly 105 is coupled to the ESC 103 and a facility plate 107. The facility plate 107, supported by a ground plate 111, is configured to facilitate electrical, cooling, heating, and gas connections with the substrate support assembly 101. The ground plate 111 is supported by the bottom 106 of the processing chamber. A dielectric plate 109 electrically insulates the facility plate 107 from the ground plate 111.

The ESC base assembly 105 includes a base channel 115 fluidly coupled to a cryogenic chiller 117. The cryogenic chiller 117 provides a base fluid, such as a refrigerant, to the base channel 115 so that the ESC base assembly 105, and consequently, the substrate 124, may be maintained at a predetermined cryogenic temperature. Similarly, the facility plate 107 includes a facility channel 113 (further detailed in FIG. 2) fluidly coupled to a heating fluid source 119. The heating fluid source 119 provides facility fluid to the facility channel 113 so that the facility plate 107 is maintained a predetermined temperature. The heating fluid source 119 contains a heat exchange fluid that maintains the facility plate 107 at a temperature at or near ambient temperatures. In one example, the base fluid from the cryogenic chiller 117 maintains the ESC base assembly 105 at a temperature lower than a temperature of the facility plate 107.

The heating fluid source 119 is in fluid communication with the facility channel 113 via a facility inlet conduit 127 connected to an inlet (not shown) of the facility channel 113 and via a facility outlet conduit 129 connected to an outlet (not shown) of the facility channel 113 such that the facility plate 107 is maintained at a predetermined ambient temperature. The heat exchange fluid may include a material that can maintain an ambient temperature between about −10 degrees Celsius to about 60 degrees Celsius. The heating fluid source 119 provides the heat exchange fluid, which is circulated through the facility channel 113 of the facility plate 107. The heat exchange fluid is generally dielectric or electrically insulative so that an electrical path is not formed through the heat exchange fluid when circulated through the substrate support assembly 101. A non-limiting example of a suitable facility fluid includes fluorinated heat transfer fluids such as perfluoropolyether (PFPE) fluids. The heat exchange fluid flowing through the facility channel 113 enables the facility plate 107 to be maintained at the predetermined ambient temperature, which assists in maintaining the dielectric plate 109 at the predetermined ambient temperature.

The ESC 103 has a support surface 130 and a bottom surface 132 opposite the support surface 130. In one embodiment, which can be combined with other embodiments described herein, the ESC 103 is fabricated from a ceramic material, such as alumina ($Al_2O_3$), aluminum nitride (AlN) or other suitable material. Alternatively, the ESC 103 may be fabricated from a polymer, such as polyimide, polyetheretherketone, polyaryletherketone, and the like.

A bond layer 133 is provided at an interface between the bottom surface 132 of the ESC 103 and a top surface 134 of the ESC base assembly 105. The ESC 103 may be made of alumina ($Al_2O_3$) or aluminum nitride (AlN). The ESC base assembly 105 may be made of aluminum (Al), molybdenum (Mo), a ceramic, or combinations thereof. The bond layer 133 allows strain to be absorbed due to small differences in the CTE of the ESC 103 and ESC base assembly 105 from temperatures of about 90 degrees Celsius to about −200 degrees Celsius during operation.

The ESC 103 includes a chucking electrode 126 disposed therein. The chucking electrode 126 may be configured as a mono polar or bipolar electrode, or other suitable arrangement. The chucking electrode 126 is coupled through an RF filter and the facility plate 107 to a chucking power source 135, which provides a DC power to electrostatically secure the substrate 124 to the support surface 130 of the ESC 103. The RF filter prevents RF power utilized to form a plasma (not shown) within the plasma processing chamber 100 from damaging electrical equipment or presenting an electrical hazard outside the chamber.

The ESC 103 includes one or more resistive heaters 128 embedded therein. The resistive heaters 128 are utilized to control the temperature of the ESC 103, which is cooled by the ESC base assembly 105, such that processing temperatures suitable for processing a substrate 124 disposed on the support surface 130 of the substrate support assembly 101 may be maintained. The resistive heaters 128 are coupled through the facility plate 107 and an RF filter to a heater power source 136. The RF filter prevents RF power utilized to form a plasma (not shown) within the plasma processing chamber 100 from damaging electrical equipment or presenting an electrical hazard outside the chamber. The heater power source 136 may provide 500 watts or more power to the resistive heaters 128. The heater power source 136 includes a controller (not shown) utilized to control the operation of the heater power source 136, which is generally set to heat the substrate 124 to a predetermined operational temperature range. In one embodiment, which can be combined with other embodiments described herein, the resistive heaters 128 include a plurality of laterally separated heating zones, wherein the controller enables at least one zone of the resistive heaters 128 to be preferentially heated relative to the resistive heaters 128 located in one or more of the other zones. For example, the resistive heaters 128 may be arranged concentrically in a plurality of separated heating zones. The resistive heaters 128 maintain the substrate 124 at a temperature suitable for processing. In one embodiment, which can be combined with other embodiments described herein, the operational temperature includes the processing temperatures. The operational temperature range is between about −250 degrees Celsius and about 400 degrees Celsius. For example, the operational temperature range is between about −200 degrees Celsius and about 350 degrees Celsius.

Power to the resistive heaters 128 and the ESC 103 from the heater power source 136 and the chucking power source 135, respectively, is provided by an electrical feedthrough or electrical connector 138. The electrical connector 138 is described in more detail below.

The cryogenic chiller 117 is in fluid communication with the base channel 115 via a base inlet conduit 123 connected to an inlet of the base channel 115 and via a base outlet conduit 125 connected to an outlet of the base channel 115 such that the ESC base assembly 105 is maintained at a predetermined cryogenic temperature. In one embodiment, which can be combined with other embodiments described herein, the cryogenic chiller 117 contains a base fluid. The base fluid comprises a composition that remains a liquid a cryogenic temperature less than −50 degrees Celsius at operating pressures. The base fluid is generally dielectric or electrically insulative so that an electrical path is not formed through the base fluid when circulated through the substrate support assembly 101. A non-limiting example of suitable base fluid includes fluorinated heat transfer fluids. The cryogenic chiller 117 provides the base fluid, which is circulated through the base channel 115 of the ESC base assembly 105. The base fluid flowing through the base channel 115 enables the ESC base assembly 105 to be maintained at the cryogenic temperature, which assists in controlling the lateral temperature profile of the ESC 103 so that the substrate 124 disposed on the ESC 103 is uniformly maintained within the operational temperature range. In one embodiment, which can be combined in other embodiments described herein, the cryogenic chiller 117 is a single-stage chiller operable to maintain the cryogenic temperature less than about −50 degrees Celsius. In another embodiment, which can be combined in other embodiments described herein, the cryogenic chiller 117 is a two-stage chiller that utilizes refrigerant internal to the two-stage chiller such the base fluid is maintained at the cryogenic temperature less than −50 degrees Celsius.

Figure 2:
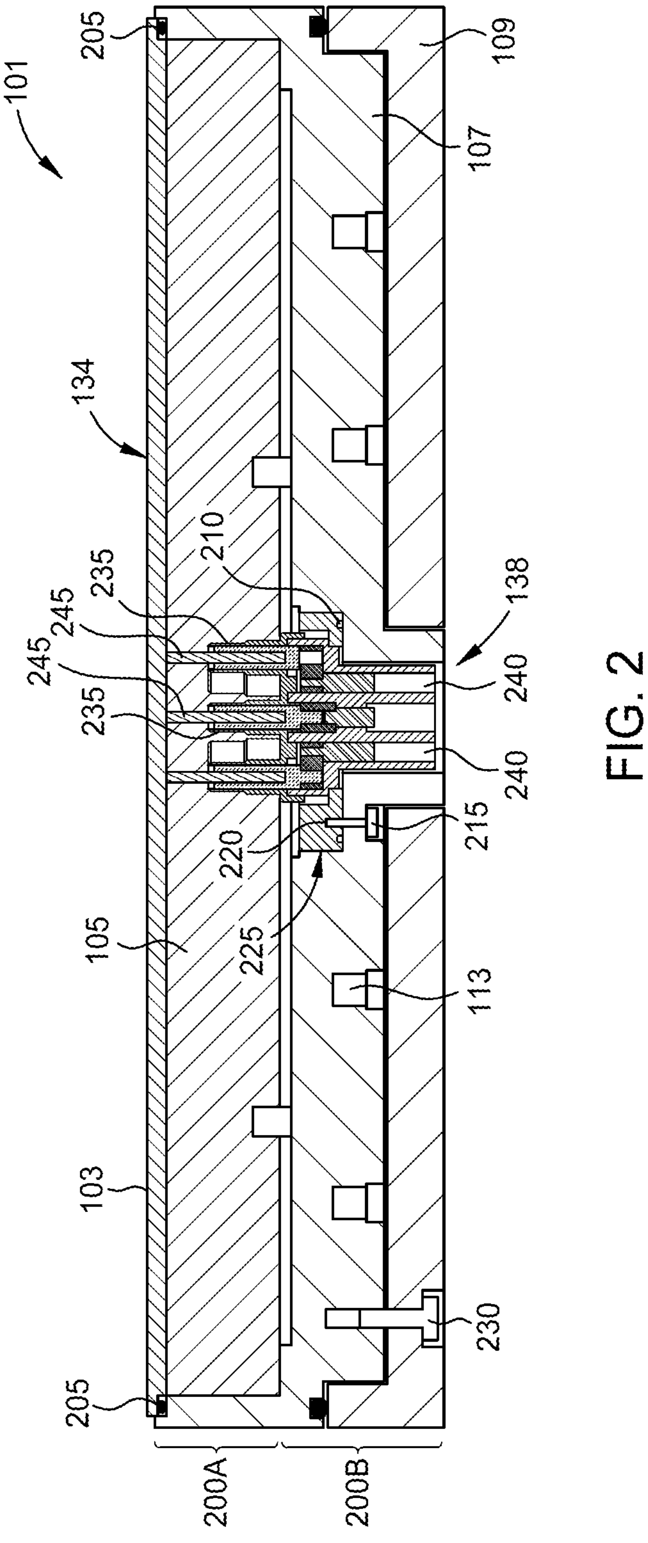
FIG. 2 is a schematic sectional view of a portion of an exemplary substrate support assembly according to an embodiment.

FIG. 2 is a schematic sectional view of a portion of an exemplary substrate support assembly 101 according to an embodiment. The substrate support assembly 101 is configured to enable cryogenic temperature operation of ESC 103 so that a substrate 124 (shown in FIG. 1) disposed thereon is maintained within the operational temperature range. The ESC base assembly 105, the facility plate 107, and the dielectric plate 109 are shown in FIG. 2. The ESC 103 is also shown coupled to the top surface 134 of the ESC base assembly 105. Also shown is the electrical connector 138 positioned in a geometric center of the substrate support assembly 101. It is contemplated that the electrical connector 138 may be positioned in another location.

During use, as described above, the ESC 103 and the ESC base assembly 105 are chilled by the cryogenic chiller 117 and the facility plate 107 is warmed by the heating fluid source 119. The substrate support assembly 101 is generally divided into two zones, such as a first zone 200A and a second zone 200B. The first zone 200A and the second zone 200B are characterized as different pressure regions. For example during processing of the substrate, the first zone 200A is maintained at negative or vacuum pressures while the second zone 200B is maintained at or near atmospheric or ambient pressures. A seal 205 prevents leakage between the first zone 200A and the second zone 200B. In another embodiment, the first zone 200A and the second zone 200B are characterized as different temperature regions, which may or may not be also characterized as different pressure regions. For example during processing of the substrate, the first zone 200A is maintained at a first temperature while the second zone 200B is maintained at a second temperature. The first temperature is lower than the second temperature. In one example, the first zone 200A is maintained at cryogenic temperatures while the second zone 200B is maintained at or near ambient temperatures or much higher than cryogenic temperatures. Examples of the first temperature include about −10 degrees Celsius to about −150 degrees Celsius, including down to about −200 degrees Celsius. Examples of the second temperature includes above about 0 degrees Celsius to about 350 degrees Celsius, including up to about 400 degrees Celsius.

The electrical connector 138 functions in one aspect to maintain the pressures within the first zone 200A and the second zone 200B. A seal 210 interfaced between the facility plate 107 and the electrical connector 138 to maintain isolation of the pressures within the first zone 200A and the second zone 200B. The seal 210 may be any suitable seal or gasket, such as an O-ring type, cup seal, lip seal, or gasket, among others. The seal 210 made fabricated from a polymeric, elastomeric material or other suitable material.

The electrical connector 138 is coupled to the ESC base assembly 105 by a plurality of fasteners 215 (only one is shown in this view), such as a screw or bolt. Each fastener 215 is received in a threaded hole 220 formed in a body 225. The dielectric plate 109 is coupled to the facility plate 107 by one or more fasteners 230 (only one is shown in this view), such as a screw or bolt.

The electrical connector 138 may include an upper piece 300A and a lower piece 300B. The upper piece 300A includes a plurality of upper or first sockets 235. The lower piece 300B includes a plurality of lower or second sockets 240. Each of the first sockets 235 and the second sockets 240 are configured as female electrical connector interfaces. Each of the first sockets 235 are configured to receive pins 245 of electrical lines coupled to either of the resistive heaters 128 (shown in FIG. 1) or the chucking electrode 126 (shown in FIG. 1) of the ESC 103. Each of the second sockets 240 are configured to receive a pogo pin type connector (not shown) or other suitable electrical connector coupled to either the heater power source 136 or the chucking power source 135 (both shown in FIG. 1).

Figure 3:
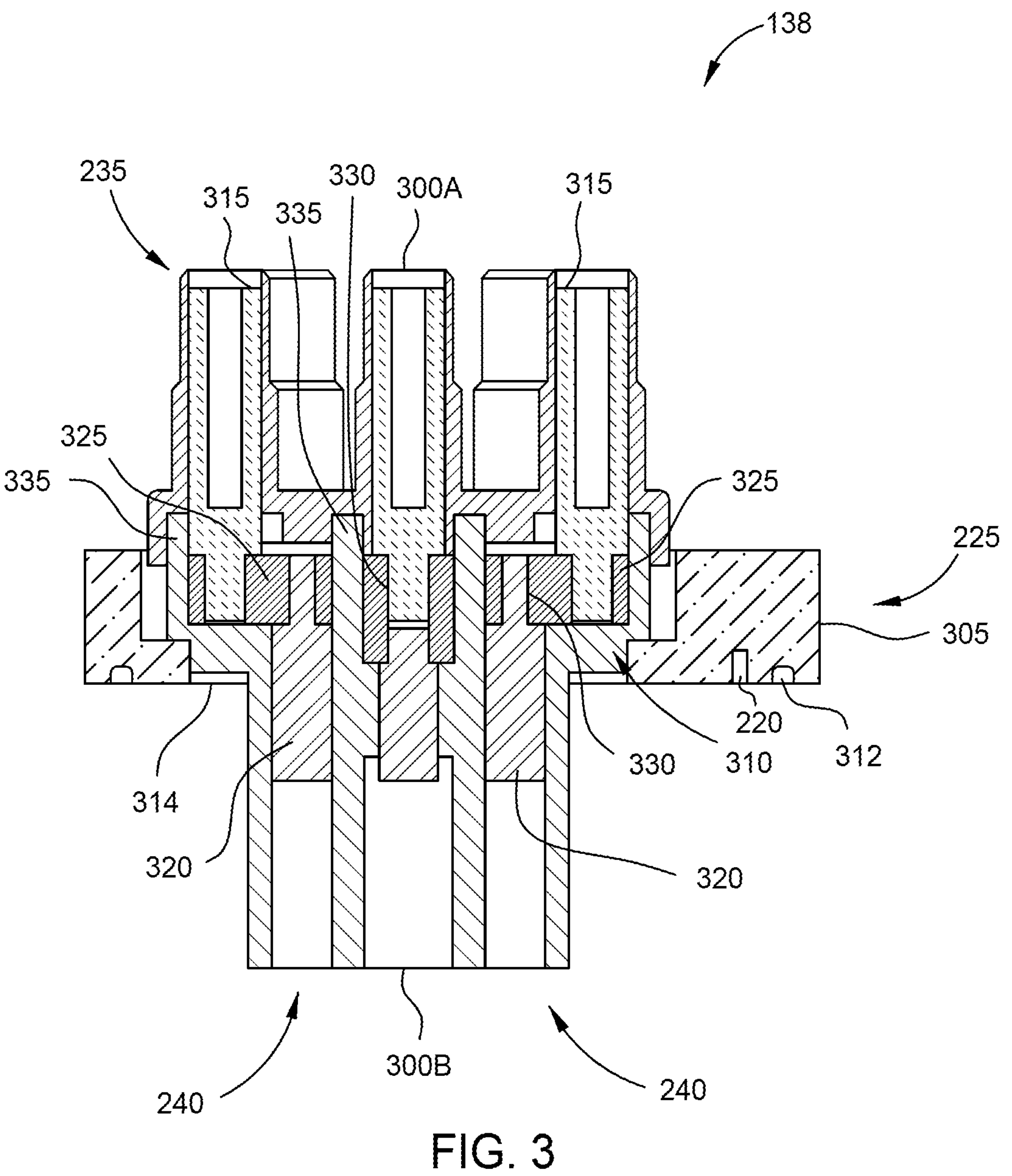
FIG. 3 is a sectional view of the electrical connector according to an embodiment along lines 3-3 of FIG. 5.

FIG. 3 is a sectional view of the electrical connector 138 as disclosed herein. The electrical connector 138 includes an upper or first piece 300A and a lower or second piece 300B opposing the first piece 300A. The first piece 300A and the second piece 300B are coupled to each other. The second piece 300B is coupled to an intermediate or third interface body 305.

A portion of the electrical connector 138 is disposed in the first zone 200A (shown in FIG. 2) and another portion of the electrical connector 138 is disposed in the second zone 200B (shown in FIG. 2). For example, the first piece 300A and the third interface body 305 are positioned in the first zone 200A while the second piece 300B is positioned in the second zone 200B (with respect to pressure). In one embodiment, the first piece 300A and the third interface body 305 are a vacuum portion of the electrical connector 138 while the second piece 300B is an atmospheric or ambient portion of the electrical connector 138.

In FIG. 3, at least two second sockets 240 and three first sockets 235 are shown in cross-section, while two first sockets 235 are at least partially visible behind the cross-sections of the three first sockets 235. Each of the first sockets 235 are formed in the first piece 300A and each of the second sockets 240 are formed in the second piece 300B. Each of the first piece 300A and the second piece 300B are fabricated from dielectric materials to electrically insulate a plurality of conductive electrical unions 310 disposed between the first piece 300A and the second piece 300B. In one example, the first piece 300A is fabricated from a polymer material, such as thermoplastic material, for example a polyether ether ketone (PEEK) material. In another example, the second piece 300B is fabricated from high dielectric constant material, such as a ceramic material, for example aluminum oxide. The third interface body 305 may be fabricated from a metallic material, such as titanium. A seal groove 312, for receiving the seal 210 (shown in FIG. 2), is formed in a lower surface 314 of the third interface body 305. Each of the first piece 300A and the second piece 300B may be brazed, potted, or otherwise coupled to the third interface body 305. The ceramic material of the second piece 300B facilitates thermal insulation. The ceramic material of the second piece 300B also facilitates brazing in order to couple the electrical connector 138 together.

The connection between the third interface body 305 and the second piece 300B is a relatively small surface to surface contact. This may provide a thermal choke to help isolate the seal 210 from the colder ESC 103. Also, the connection between the first piece 300A and the second piece 300B, and the third interface body 305 coupled to the back of the second piece 300B may also help thermally isolate the seal 210.

Each conductive electrical union 310 includes upper or first electrical terminals 315, lower or second electrical terminals 320 and connecting tabs 325. Each of the first electrical terminals 315 extend from the conductive electrical union 310 into the first sockets 235, and each of the second electrical terminals 320 extend from the conductive electrical union 310 into the second sockets 240. The conductive electrical union 310 also includes a plurality of connecting tabs 325. One of the connecting tabs 325 is disposed between each pair of the first electrical terminals 315 and the second electrical terminals 320. The connecting tab 325 is an electrically conductive metal coupled to and/or at least partially surrounding each of the first electrical terminals 315 and the second electrical terminals 320. Separate connecting tabs 325 provide the electrically connection within the electrical connector 138 between each pair of first and second electrical terminals 315, 320. Some of the connecting tabs 325 extend laterally so that the centerlines of mating electrical terminals 315, 320 do not have to be aligned. This allows the pitch of first electrical terminals 315 to be different than the pitch of the electrical terminals 320. In the example depicted herein, the pitch of first electrical terminals 315 is greater than the pitch of the electrical terminals 320, thus allowing the second sockets 240 to be arranged more densely and take up less space than first sockets 235.

The first electrical terminals 315, the second electrical terminals 320 and the connecting tab 325 are made from electrically conductive materials suitable of efficient electrical transmission. Examples of conductive materials include molybdenum (Mo), copper (Cu), or other electrically conductive metals. The electrically conductive metals may be coated with another electrically conductive metal, such as silver (Ag) or gold (Au). In a specific example, the first electrical terminals 315 are Cu coated with Ag, the second electrical terminals 320 are Mo, and the connecting tabs 325 is Cu.

One or both of the first electrical terminals 315 and the second electrical terminals 320 may be coupled to the connecting tab 325 by brazing, or by a threaded connection 330. The second piece 300B includes protruding sidewalls 335 that separate the connecting tabs 325 and into the first piece 300A. The protruding sidewalls 335 provide electrical insulation between the different connecting tabs 325 coupling each pair of each pair of first and second electrical terminals 315, 320 so that electrical breakdown and shorting are substantially prevented. The protruding sidewalls 335 also electrical separate adjacent electrical paths (e.g., first electrical terminals 315 electrically connected by the connecting tab 325 to respective second electrical terminals 320).

Figure 4:
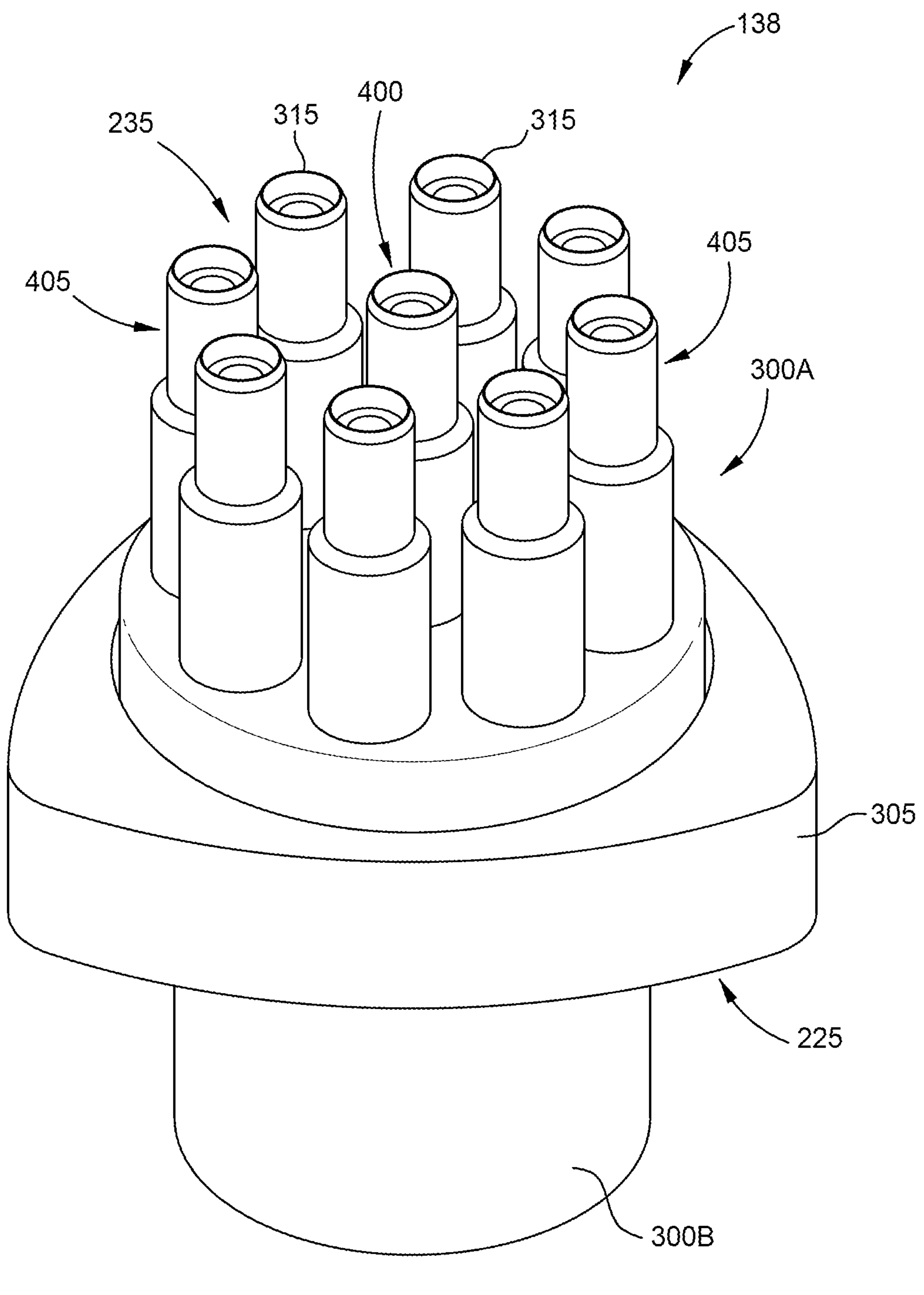
FIG. 4 is an isometric view of the electrical connector as disclosed herein.
Figure 5:
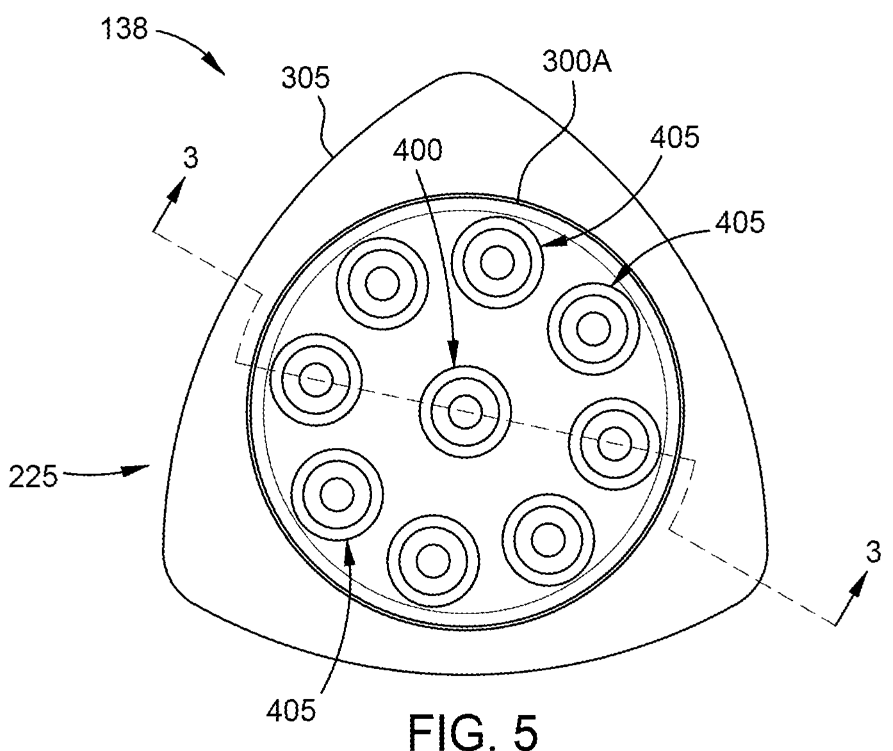
FIG. 5 is a top plan view of the electrical connector.

FIG. 4 is an isometric view of the electrical connector 138 as disclosed herein. FIG. 5 is a top plan view of the electrical connector 138 and FIG. 6 is a bottom plan view of the electrical connector 138.

Figure 6:
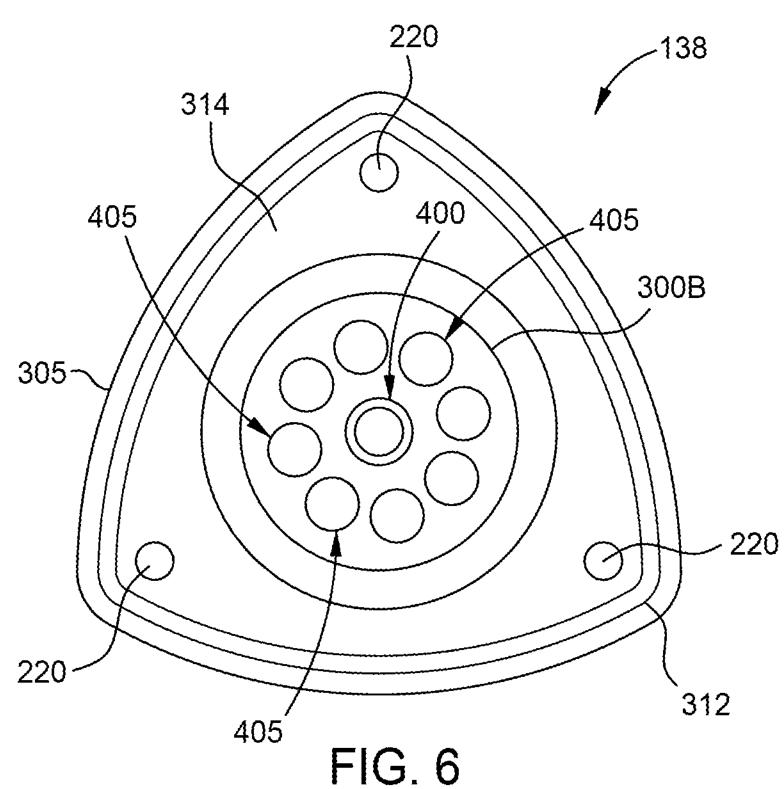
FIG. 6 is a bottom plan view of the electrical connector.

Shown in FIGS. 4, 5 and 6 is a central terminal set 400 surrounded by a plurality of peripheral terminal sets 405. Each of the central terminal set 400 and the peripheral terminal sets 405 comprises a separate electrical path through a paired first and second electrical terminals 315, 320. The central terminal set 400 comprises one of the first electrical terminals 315 that is electrically connected to one of the second electrical terminals 320 by one of the connecting tabs 325. Likewise, each of the plurality of peripheral terminal sets 405 comprises one of the first electrical terminals 315 that is electrically connected to one of the second electrical terminals 320 by one of the connecting tabs 325. Thus, nine separate electrical paths (one central terminal set 400 and eight peripheral terminal sets 405) are shown in FIGS. 5 and 6.

The central terminal set 400 is coupled to the chucking electrode 126 (shown in FIG. 1) of the ESC 103. At least a portion of the peripheral terminal sets 405 are dedicated to heater elements of the resistive heaters 128 (shown in FIG. 1). One of the peripheral terminal sets 405 may be coupled to ground.

In one example, the electrical connector 138 is operable to conduct up to about 25 amps of current during operation at a temperature range of about 25 degrees Celsius to at least about −90 degrees Celsius. For example, the electrical connector 138 can operate at a temperature range of at least 15 degrees to at least −90 degrees Celsius. The electrical connector 138 provides a voltage standoff (breakdown voltage) of at least about 7 kilovolts (kV) between the various electrical paths as well as between the electrical paths and the interface bodies (e.g., first piece 300A, second piece 300B and third interface body 305). This reduces the potential for arcing within the substrate support assembly 101. The electrical connector 138 provides suitable vacuum sealing down to and including pressures of about $10^{-3}$ Torr (e.g., about 0.0001934 pounds per square inch (psi)) during operation, including at low operation temperatures. Further, the electrical connector 138 provides an electrical and sealing interface during operation including the above using a polymer or elastomeric seal 210.

Figures 7A, 7B:
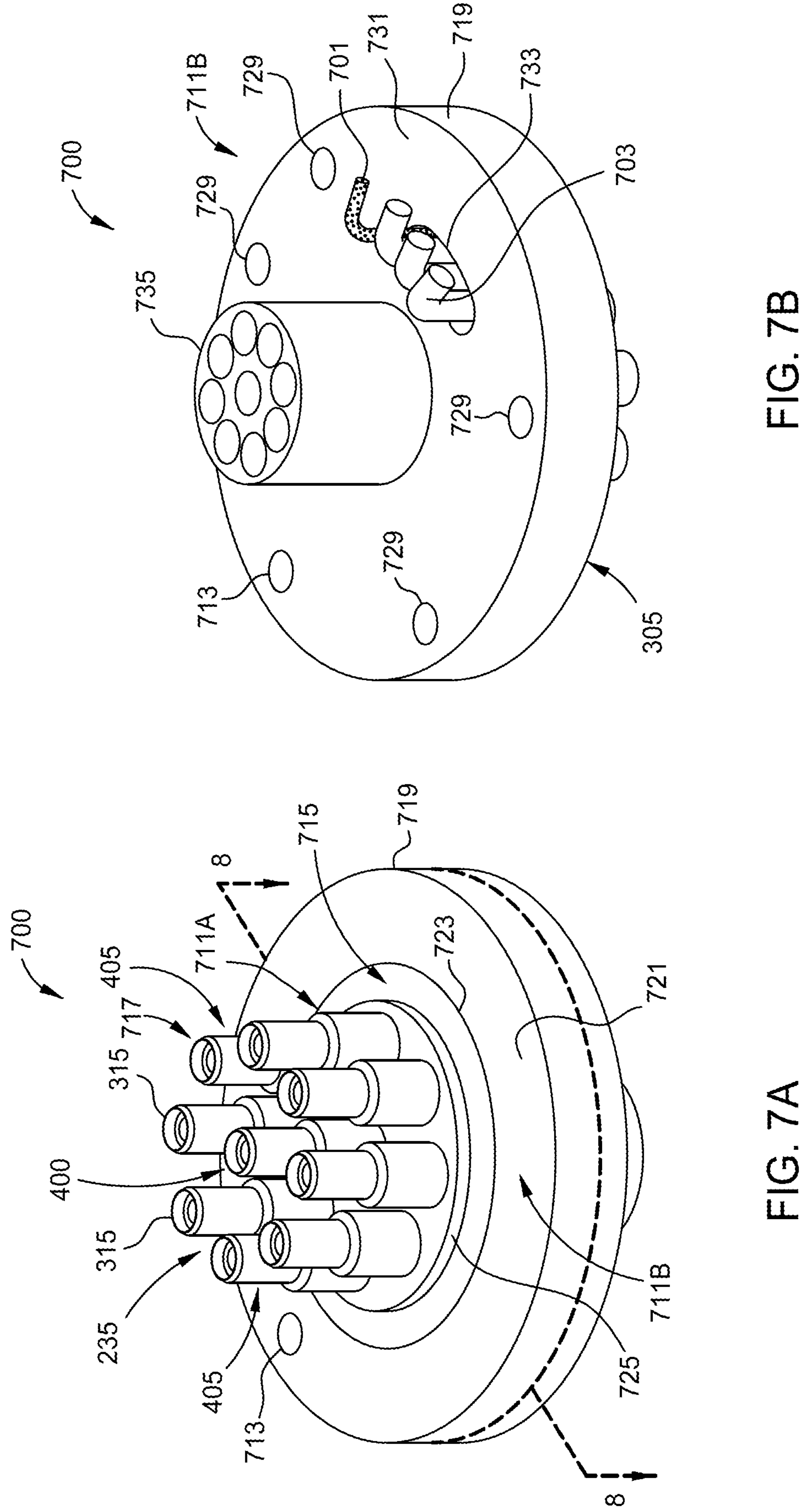
FIG. 7A is an isometric top view of another embodiment of an electrical connector suitable for use in the plasma processing chamber of FIG. 1, among other processing chambers.
FIG. 7B is an isometric bottom view of the electrical connector according to another embodiment.
Figure 8:
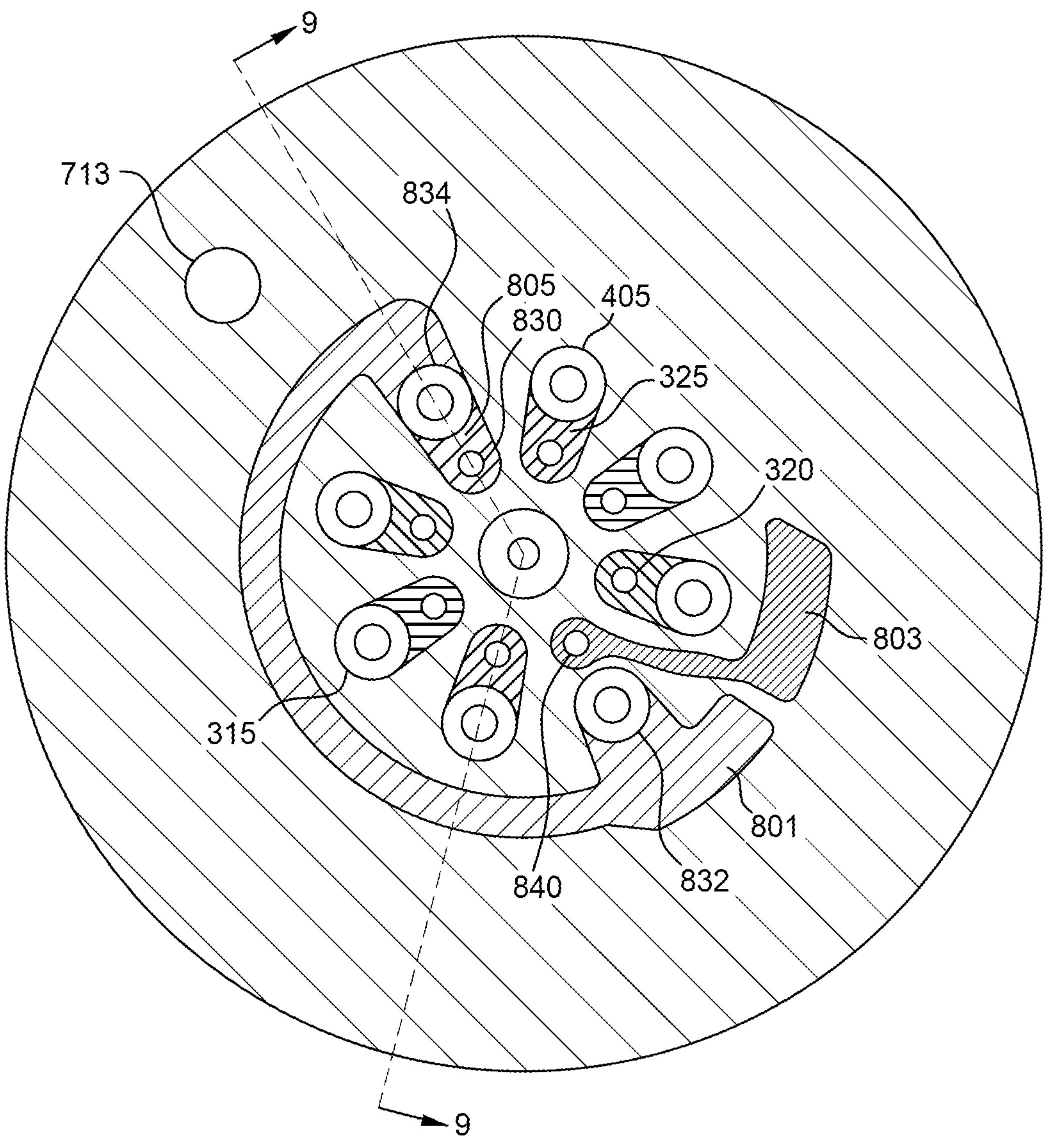
FIG. 8 is a sectional view of the electrical connector according to an embodiment along lines 8-8 of FIG. 7A.
Figure 9:
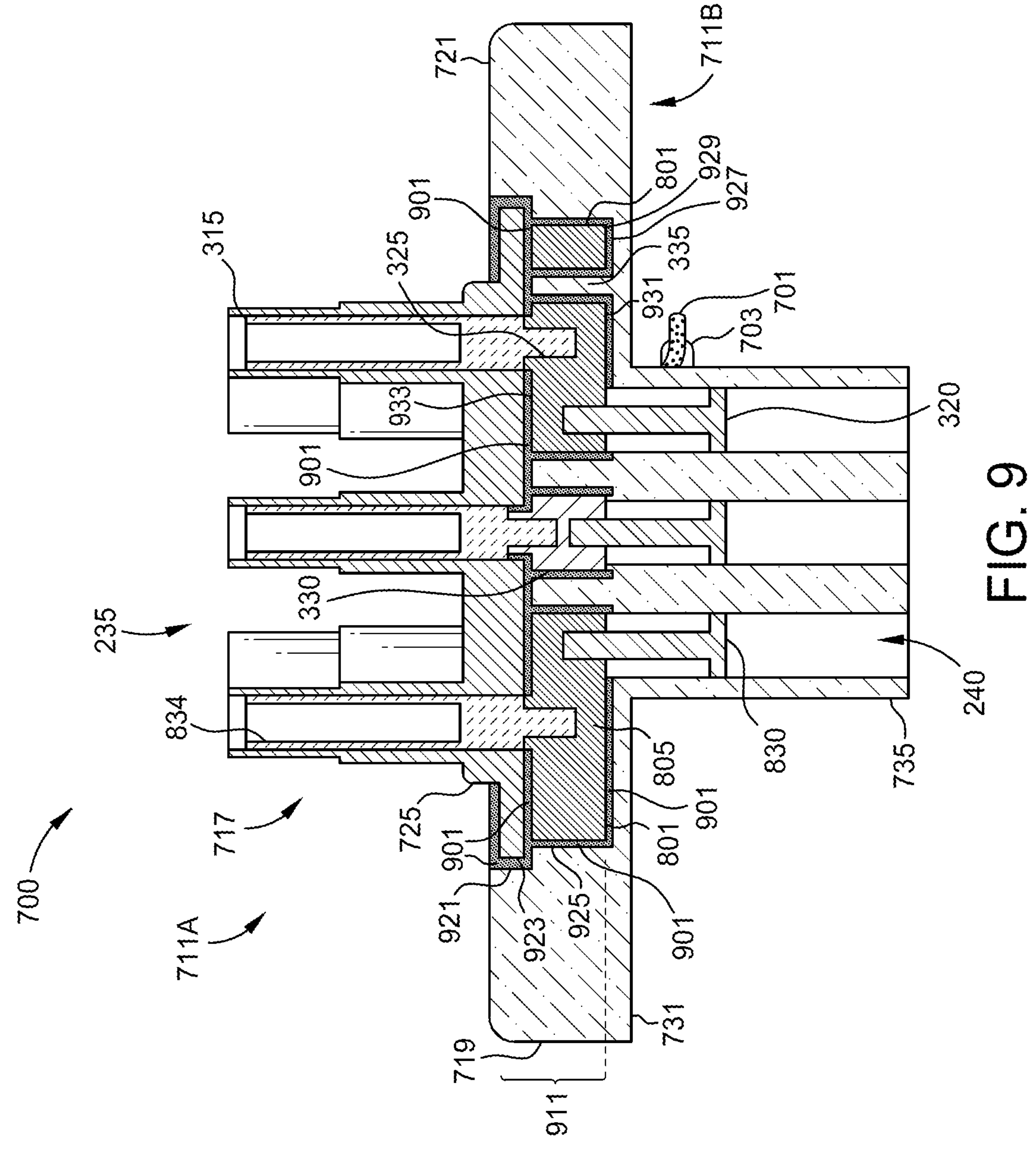
FIG. 9 is a sectional view of the electrical connector according to an embodiment along lines 9-9 of FIG. 8.
Figure 10:
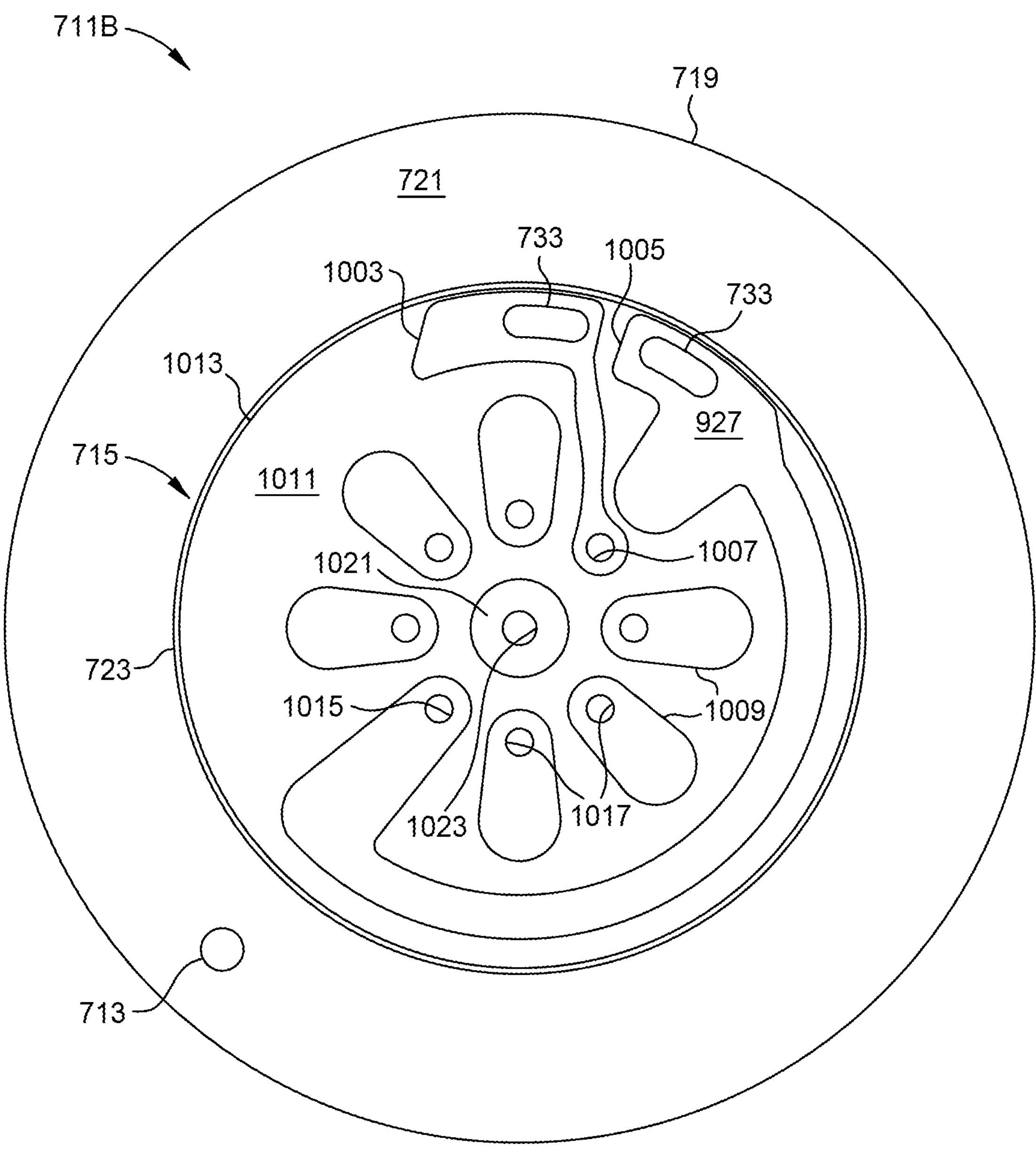
FIG. 10 is a top view of a portion of the electrical connector illustrated in FIG. 7A.

FIG. 7A is an isometric top view of another embodiment of an electrical connector 700 that may be used in place of the electrical connector 138 of FIG. 1. FIG. 7B is an isometric bottom view of the electrical connector 700. FIG. 8 is a sectional view of the electrical connector 700 taken along section lines 8-8 of FIG. 7A. FIG. 9 is a sectional view of the electrical connector 700 taken along section lines 9-9 of FIG. 8. FIG. 10 is a top view of the second interface body 711B.

The electrical connector 700 includes a first interface body 711A and the second interface body 711B. The first interface body 711A includes a connector cover 717, the connector cover 717 includes a central terminal set 400 surrounded by a plurality of peripheral terminal sets 405, and an exterior flange area 725. The exterior flange area 725 includes a shoulder and shelf extending radially outward to the outer diameter of the connector cover 717. The second interface body 711B includes a top face 721, a recess 715 that is concentric with an outer diameter 719 of the second interface body 711B, a potting material 901 disposed between the first interface body 711A and the second interface body 711B, and an index hole 713. The index hole 713 passes through the second interface body 711B from the top face 721 to the bottom face 731 and is radially offset from the center of the electrical connector 700. The connector cover 717 is disposed over the recess 715 and a portion of the potting material 901 (shown in more detail in FIG. 9). According to some embodiments, the outer diameter of the connector cover 717 has a diameter that is less than an outer diameter 723 of the recess 715 such that a portion of the potting material 901 is exposed between the connector cover 717 and body 711B. Alternatively, the outer diameter of the connector cover 717 may be the same size as or larger than the outer diameter of the recess 715 such that the potting material 901 is not exposed between the connector cover 717 and body 711B. The potting material 901 is configured to maintain a vacuum in the processing region 110. The potting material 901 sealingly couples the first interface body 711A and the second interface body 711B. When the processing region is in operation, the connector 700 enables electrical current to pass through the connector 700 without fluid leaking into or out of the processing region 110. The connector 700 provides a mean to maintain a pressure differential between the first interface body 711A and the second interface body 711B.

The electrical connector 700 enhances the operating potential of the substrate support 101 by enabling a reduction of thermal energy transferred between the first interface body 711A and the second interface body 711B and being able to maintain the vacuum in the processing region and the atmospheric conditions outside of the processing chamber 100. For example, the electrical connector 700 is configured to maintain a pressure differential within the substrate support 101.

As shown in FIG. 7B, the second interface body 711B also includes a bottom face 731, a connection port 733, and a connection boss 735. The connection port 733 is an aperture formed through the bottom face 731 that is configured to allow a common bus bar connection 701 and a return power connection 703 to connect with a power source 135. Multiple connection ports 733 are also contemplated. According to some embodiments, the bottom face 731 may also include a plurality of blind holes 729 located in the bottom face 731 arranged in a radial pattern around the center of the electrical connector 700. The blind holes 729 may be threaded or have a threaded insert that enables the electrical connector 700 to be coupled to a facility plate 107. The connection boss 735 is concentric with the outer diameter 719 of the second interface body 711B.

The central terminal set 400 includes one of the first electrical terminals 315 that is electrically connected to one of the second electrical terminals 320 by one of the connecting tabs 325. The second electrical terminals 320 are disposed within the connection boss 735. Likewise, some of the plurality of peripheral terminal sets 405 comprises one of the first electrical terminals 315 that is electrically connected to one of the second electrical terminals 320 by one of the connecting tabs 325. The second electrical terminals 320 in the connection boss 735 are better shown in FIG. 9.

FIG. 9 is a sectional view of the electrical connector 700 as disclosed herein that shows the recess 715 and interaction of the first interface body 711A and the second interface body 711B. Additionally, FIG. 9 shows an example of where the potting material 901 is present. The potting material 901 is capable of maintaining a seal through the operational temperatures described above. The potting material 901 is an electrical insulator and may be an adhesive, epoxy, or other suitable material. The potting material 901 may fill in any gaps that may exist between the first interface body 711A and the second interface body 711B. The potting material 901 is disposed in a space defined between the first vertical face and the outer face is filled void free with the adhesive. The potting material 901 fills in gaps to create void free separations, thereby reducing any creepage path between electrical components. For example, if the bus bar 801 was not as tall as the connection tab 325, more potting material would be placed in the bus bar recess 1005.

Referring now to FIG. 8, the second electrical terminals 320 include a bus electrical terminal 830 and a power return electrical terminal 840. In some embodiments, the bus electrical terminal 830 and a power return electrical terminal 840 are disposed radially opposite each other. The first electrical terminals 315 include a first common electrical terminal 832 and a second common electrical terminal 834. In some embodiments, the first common electrical terminal 832 and the second common electrical terminal 834 are disposed radially opposite each other. In some embodiments, the bus electrical terminal 830 is disposed adjacent to the second common electrical terminal 834 and the power return electrical terminal 840 is disposed adjacent but separated from the first common electrical terminal 832 by the second interface body 711B.

A bus bar 801 and a power return bar 803 and a plurality of tabs 325 are disposed in the recess 715 of the second interface body 711B. The recess 715 formed in the second interface body 711B is better shown in FIG. 10. Some of the peripheral terminal sets 405 comprise a separate electrical path through a paired first and second electrical terminal 315, 320. In some embodiments, the first common electrical terminal 832 and the second common electrical terminal 834 are connected by the bus bar 801. The bus bar 801 is connected to a bus electrical terminal 830 and a common bus bar connection 701, creating a buss bar electrical path. The first common electrical terminal 832, the second common electrical terminal 834 and the bus bar 801 are connected to the bus electrical terminal 830 by a connection portion 805 of the bus bar 801. The power return bar 803 is in the recess 715 of the second interface body 711B and is connected to the return power connection 703 and a power return electrical terminal 840, creating a power return bar electrical path. The power return electrical terminal 840 is one of the plurality of second electrical terminals 320. The connections 701, 703 may be soldered wires, but other methods of electrical connection are contemplated. The connections 701, 703 may also include cables and other electrical transmission devices. Thus, nine separate electrical paths (one central terminal set 400, six peripheral terminal sets 405, one buss bar electrical path, and one power return bar electrical path) are shown in FIG. 8.

The connections shown in FIG. 8 are insulated and the bodies 711A, 711B, are held together by the potting material 901. The electrical connector 700 is completely sealed with the potting material 901 to keep the pressures experienced by the first zone 200A and the second zone 200B separate, i.e., to prevent vacuum leakage through the connector. Similar to other embodiments, the first zone 200A is maintained at negative or vacuum pressures while the second zone 200B is maintained at or near atmospheric or ambient pressures. The potting material 901 substantially prevents leakage between the first zone 200A and the second zone 200B. In another embodiment, the first zone 200A and the second zone 200B are characterized as different temperature regions, which may or may not be also characterized as different pressure regions.

FIG. 9 illustrates the first terminal 315 conductively connected to a second terminal 320 through the connection tab 325, thus forming an electrical pathway though the electrical connector 700. Another electrical pathway is formed through the bus bar 801. The bus bar pathway includes and connects at least the first common electrical terminal 832 (shown in FIG. 8), the second common electrical terminal 834, the bus bar 801, the common bus bar connection 701, and the bus electrical terminal 830. A central electrical pathway includes and connects at least a first terminal 315, a second terminal 320 through a connection 330. In this embodiment, the first common electrical terminal 832, the second common electrical terminal 834, and the bus electrical terminal 830 are connected in blind holes of the bus bar 801. The first terminal 315 and second terminal 320 are connected in blind holes of the connection tab 325 for the pathways through the peripheral terminal sets 405. The first terminal 315 and second terminal 320 are connected in blind holes of the connection 330. The use of blind holes for connections to the bus bar 801, the connection 330, and the connection tabs 325 help prevent leaks into the vacuum through the electrical connector 138.

As shown schematically in the cross section view of FIG. 9, the potting material 901 is between the connector cover 717, the sidewalls 335, a first vertical face 921, and over at least the various components 801, 805, 330, 325 within the electrical connector 700. The second interface body 711B includes a plurality of internal recess walls 925 of and recess 715. FIG. 9 is meant to illustrate an example of locations the potting material 901 may be located. For example, the potting material 901 covers the exterior flange area 725 of the cover 717, fills voids, gaps, and/or spaces in the connector 700, and creates a seal between the cover 717 and the first vertical face 921. The potting material 901 can be disposed on an outer face 923 of the exterior flange area 725. For example, the potting material 901 is disposed between and in contact with all of the outer face 923 of the first interface body 711A and the first vertical face 921 of the recess 715. The potting material 901 sealingly secures the first vertical face 821 and the outer face 923. A space defined between the first vertical face 821 and the outer face 923 is filled void free with the potting material 901. The potting material 901 can be disposed on and in a space between the cover 717, the internal recess walls 925, and the adjacent surfaces of the bus bar 801, power return bar 803 connecting tabs 325, and the connection 330. Additionally, the potting material 901 can be present in the lateral gaps and/or spaces between the second interface body 711B, the sidewalls 335, the bus bar 801, power return bar 803 connecting tabs 325, and the connection 330. For example, the recess 715 of the second interface body 711B includes a lower face 927. The lower face 927 is parallel to the top face 721. A lower face 929 of the bus bar 801 is about parallel to the lower face 927 of the second interface body 711B. The lower face 929 of the bus bar 801 is laterally separated from the lower face 927 of the second interface body 711B by the potting material 901. Similarly, the cover 717 of the first interface body 711A is separated from an upper face 933 of the connecting tabs 325 by the potting material 901. In another example, the lower face 927 of the second interface body 711B is laterally separated from a lower face 931 of the connecting tabs 325 by the potting material 901. The separations ensure both vertical and horizontal insulation.

The potting material 901 can electrically insulate the electrical pathways of the electrical connector 700, and seal the connector when used in vacuum environments. The potting material 901 creates void free seals within the electrical connector 700. Further the potting material 901 can hold the components of the electrical connector 700 together to form a unitary body. The unitary body may also be referred to as a solid composite body. The potting material 901 creates a seal such that the electrical connector 700 seals a pressure experienced by at least the top face 721 from a pressure experienced by the bottom face 731. In other words, the potting material 901 maintains a pressure differential across the top face 721 *f* and the bottom face 731. By having a void free seal, when a vacuum is induced in the processing chamber 100, gas does not leak into atmospheric conditions outside of the processing chamber 100.

The recess 715, as shown in FIG. 10, is provided to illustrate the recesses within the second interface body 711B and recess 715. According to some embodiments, the recess 715 includes at least a first recess 1013 and internal recesses 1003, 1005, 1009, 1021. The recess 715 has an annular shape about the center of the electrical connector 700. The recess 715 begins at the recess outer diameter 723 and extends down from the top face 721, to having a first face 1011 of the first recess 1013. The internals recesses begin at the first face 1011 and extend to the lower face 927, and have a recess depth 911, as shown in FIG. 9. The internals recesses are defined by the internal recess walls 925 (FIG. 9).

The internals recesses 1003, 1005, 1009, 1021 include at least a power return recess 1003, a bus bar recess 1005, one or more tab recesses 1009, and a connection recess 1021. The tab recesses 1009 include a terminal aperture 1017. The tab recesses 1009 are configured to affix the connection tab 325 below the first face 1011. The power return recess 1003 includes a terminal aperture 1007, a connection port 733 formed through to the bottom face 731. The power return recess 1003 is configured to affix the power return bar 803 below the first face 1011. The bus bar recess 1005 includes a terminal aperture 1015, a connection port 733 through to the bottom face 731, and is configured to affix the bus bar 801 below the first face 1011. The connection recess 1021 is along the center axis of the electrical connector 700, includes a terminal aperture 1023, and is configured to hold the connection 330 beneath the first face 1011. The lower face 927 is at an equal depth for the internal recesses, but varying depths are contemplated.

The terminal apertures 1007, 1015, 1017, 1023 form ports through the second interface body 711B and out to the second sockets 240 of the connection boss 735. The internals recesses are configured to be deep enough to allow the potting material 901 to at least form an insulating seal over the components 801, 803, 325, therein.

The internals recesses 1003, 1005, 1009, 1021 are defined by the internal recess walls 925. The internal recess walls 925 are about perpendicular to the top face 721 (FIG. 9).

Benefits of the present disclosure include enhance sealing of connections points within a substrate support assembly; increased range of operational temperatures; enhanced arcing resistance; and increased production life.

Benefits also include reduction of creepage path within connectors of a substrate support assembly. It is contemplated that one or more aspects disclosed herein may be combined. As an example, one or more aspects, features, components, operations and/or properties of the processing chamber 100, the substrate support assembly 101, the electrical connector 138, the electrical connector 700, the bus bar 801, and/or the potting material 901 may be combined.

While the foregoing is directed to examples of the present disclosure, other and further examples of the disclosure may be devised without departing from the basic scope thereof, and the scope thereof is determined by the claims that follow.

What is claimed is:

1. An electrical connector, comprising:
a first interface body comprising:
a connector cover; and
a plurality of first electrical terminals;
a second interface body sealingly coupled to the first interface body, comprising:
a plurality of electrical pathways;
a plurality of second electrical terminals disposed in a plurality of sockets; and
a recess disposed within the second interface body; wherein the plurality of first electrical terminals and second electrical terminals are connected by the plurality of electrical pathways;
an adhesive that sealingly couples the first interface body and the second interface body; and
a bus bar disposed in the recess, connecting at least two of the plurality of first electrical terminals to at least a one of the plurality of second electrical terminals,
wherein the bus bar is connected to a bus bar connection.

2. The electrical connector of claim 1, further comprising a power return bar coupled to at least one of the second electrical terminals disposed in sockets of the second interface body.

3. The electrical connector of claim 2, wherein the power return bar is coupled to a power return electrical terminal.

4. The electrical connector of claim 1, further comprising an index hole disposed passing through the second interface body.

5. The electrical connector of claim 1, wherein the adhesive insulates the plurality of electrical pathways from the first interface body and second interface body.

6. The electrical connector of claim 5, wherein the adhesive electrically insulates at temperatures from about −200° Celsius to about 350° Celsius.

7. The electrical connector of claim 5, wherein the adhesive fills the recess such that the electrical connector is a solid composite body.

8. The electrical connector of claim 5, wherein the recess comprises a first recess partially defined by a first vertical face, the adhesive in contact with all of an outer face of the first interface body and the first vertical face of the recess.

9. The electrical connector of claim 5, wherein the recess comprises a first recess partially defined by a recess outer diameter, the adhesive in contact with all of a face defined by the recess outer diameter.

10. An electrostatic chuck for semiconductor manufacturing, the electrostatic chuck comprising:
a first plate;
a second plate; and
an electrical connector disposed between the first plate and the second plate, the electrical connector comprising:
a first interface body comprising:
a connector cover
an outer face; and
a plurality of first electrical terminals;
a second interface body coupled to the first interface body, the second interface body comprising:
a plurality of electrical pathways;
a plurality of second electrical terminals disposed in a plurality of sockets; and
a recess disposed within the second interface body, the recess comprising a first vertical face, the first vertical face disposed adjacent the outer face of the first interface body;
an adhesive sealingly securing the first vertical face and the outer face, a space defined between the first vertical face and the outer face is filled void free with the adhesive; and
a bus bar disposed in the recess, connecting at least two of the plurality of first electrical terminals to at least a one of the plurality of second electrical terminals.

11. The electrostatic chuck of claim 10, wherein the adhesive is configured to electrically insulate at temperatures from about −200° Celsius to about 350° Celsius.

12. The electrostatic chuck of claim 10, further comprising a connecting tab disposed between a pair of a first electrical terminal and a second electrical terminal.

13. The electrostatic chuck of claim 12, wherein the adhesive is disposed on a top face and bottom face of the connecting tab.

14. The electrostatic chuck of claim 10, further comprising a power return bar coupled to at least one of the second electrical terminals disposed in sockets of the second interface body.

15. The electrostatic chuck of claim 10, wherein the plurality of first electrical terminals comprise:
a first common electrical terminal; and
a second common electrical terminal disposed radially opposite the first common electrical terminal, the first common electrical terminal and second common electrical terminal electrically coupled to the bus bar.

16. An substrate support assembly for semiconductor manufacturing, the substrate support assembly comprising:
an electrostatic chuck (ESC);
an ESC base assembly disposed between the ESC and a facility plate; and
an electrical connector disposed between and partially within the ESC base assembly and the facility plate, the electrical connector comprising:
a first interface body comprising:
a connector cover;
an outer face; and
a plurality of first electrical terminals;
a second interface body coupled to the first interface body, the second interface body comprising:
a plurality of electrical pathways;
a plurality of second electrical terminals disposed in a plurality of sockets; and
a recess disposed within the second interface body, the recess comprising a first vertical face, the first vertical face disposed adjacent the outer face of the first interface body;
an adhesive sealingly securing between the first vertical face and the outer face, a space defined between the first vertical face and the outer face is filled void free with the adhesive; and
a bus bar disposed in the recess, connecting at least two of the plurality of first electrical terminals to at least a one of the plurality of second electrical terminals.

17. The electrostatic chuck of claim 16, wherein the adhesive is disposed between the bus bar, the first interface body, and the second interface body.

18. The electrostatic chuck of claim 16, wherein the adhesive is configured to electrically insulate at temperatures from about −200° Celsius to about 350° Celsius.

19. The electrostatic chuck of claim 16, wherein the plurality of first electrical terminals comprise:
a first common electrical terminal; and
a second common electrical terminal disposed radially opposite the first common electrical terminal, the first common electrical terminal and second common electrical terminal electrically coupled to the bus bar.

20. The electrostatic chuck of claim 16, wherein the plurality of second electrical terminals comprises:
a bus electrical terminal; and
a power return electrical terminal disposed radially opposite the bus electrical terminal, the bus electrical terminal coupled to the bus bar and the power return electrical terminal coupled to a power return bar, the power return bar electrically insulated from the bus bar.

* * * * *